(12) United States Patent
Agam et al.

(10) Patent No.: US 8,741,697 B2
(45) Date of Patent: Jun. 3, 2014

(54) ELECTRONIC DEVICE INCLUDING A NONVOLATILE MEMORY STRUCTURE HAVING AN ANTIFUSE COMPONENT AND A PROCESS OF FORMING THE SAME

(75) Inventors: Moshe Agam, Portland, OR (US); Thierry Coffi Herve Yao, Portland, OR (US); Shizen Skip Liu, Clackamas, OR (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 338 days.

(21) Appl. No.: 13/232,487

(22) Filed: Sep. 14, 2011

(65) Prior Publication Data

US 2013/0062703 A1    Mar. 14, 2013

(51) Int. Cl.
*H01L 21/82* (2006.01)

(52) U.S. Cl.
USPC .............. 438/131; 438/600; 257/50; 257/530

(58) Field of Classification Search
USPC .............. 438/131, 600; 257/50, 530; 437/131
See application file for complete search history.

(56) References Cited

U.S. PATENT DOCUMENTS

| | | |
|---|---|---|
| 6,507,053 B1 | 1/2003 | Bernard et al. |
| 6,927,997 B2 | 8/2005 | Lee et al. |
| 7,046,569 B2 | 5/2006 | Ito et al. |
| 7,102,951 B2 | 9/2006 | Paillet et al. |
| 7,277,348 B2 | 10/2007 | Peng et al. |
| 7,280,425 B2 | 10/2007 | Keshavarzi et al. |
| 7,402,855 B2 | 7/2008 | Kurjanowicz |
| 7,489,535 B2 | 2/2009 | Mallikararjunaswamy |
| 7,511,982 B2 | 3/2009 | Kurjanwicz et al. |
| 7,602,029 B2 | 10/2009 | Mallikararjunaswamy |
| 7,613,913 B2 | 11/2009 | Haban et al. |
| 7,764,532 B2 | 7/2010 | Kurjanowicz et al. |
| 7,764,541 B2 | 7/2010 | Kohler et al. |

FOREIGN PATENT DOCUMENTS

WO    2006121828 A2    11/2006

OTHER PUBLICATIONS

U.S. Appl. No. 13/232,568, filed Sep. 14, 2011, "Electronic Device Including a Nonvolatile Memory Structure Having an Antifuse Component and a Process of Forming the Same", Inventors: Moshe Agam et al.

U.S. Appl. No. 13/232,745, filed Sep. 14, 2011, "Electronic Device Including a Nonvolatile Memory Structure Having an Antifuse Component and a Process of Using the Same", Inventors: Moshe Agam et al.

*Primary Examiner* — Thien F Tran
(74) *Attorney, Agent, or Firm* — Abel Law Group, LLP (57) ABSTRACT

An electronic device can include a nonvolatile memory cell, wherein the nonvolatile memory cell can include a substrate, an access transistor, a read transistor, and an antifuse component. Each of the access and read transistors can include source/drain regions at least partly within the substrate, a gate dielectric layer overlying the substrate, and a gate electrode overlying the gate dielectric layer. An antifuse component can include a first electrode lying at least partly within the substrate, an antifuse dielectric layer overlying the substrate, and a second electrode overlying the antifuse dielectric layer. The second electrode of the antifuse component can be coupled to one of the source/drain regions of the access transistor and to the gate electrode of the read transistor. In an embodiment, the antifuse component can be in the form of a transistor structure. The electronic device can be formed using a single polysilicon process.

10 Claims, 5 Drawing Sheets

FIG. 7 ic design can also be tailored to the process flow, such as allowing for increased packing density when more relaxed dimensions for a particular feature (for example, contact openings to active regions) are used. Further, more than one read transistor can be used for a single antifuse component. Before reading the NVM cell, a determination can be made whether to precharge the bit line.

ELECTRONIC DEVICE INCLUDING A NONVOLATILE MEMORY STRUCTURE HAVING AN ANTIFUSE COMPONENT AND A PROCESS OF FORMING THE SAME

FIELD OF THE DISCLOSURE

The present disclosure relates to electronic devices and processes of using electronic devices, and more particularly to, electronic devices including a nonvolatile memory cell and processes of using the same.

RELATED ART

Electronic devices can include nonvolatile memory cells. The nonvolatile memory cells include one-time programmable ("OTP") memory cells with an antifuse component. Before programming, the antifuse component is in an open or relatively high resistive state, and after programming, the antifuse component is in a relatively conductive state (as compared to before programming). In addition to the antifuse component, the nonvolatile memory call can include a read transistor, where a source region, a drain region, or a source/drain region of the read transistor is electrically connected to a terminal of the antifuse component. During programming and reading of the memory cell, current flows through the read transistor and antifuse component.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application. While numerical ranges are described herein to provide a better understanding of particular embodiments, after reading this specification, skilled artisans will appreciate that values outside the numerical ranges may be used without departing from the scope of the present invention.

The term "coupled" is intended to mean a connection, linking, or association of two or more electronic components, circuits, systems, or any combination of: (1) at least one electronic component, (2) at least one circuit, or (3) at least one system in such a way that a signal (e.g., current, voltage, or optical signal) may be transferred from one to another. A non-limiting example of "coupled" can include a direct electrical connection between electronic component(s), circuit(s) or electronic component(s) or circuit(s) with switch(es) (for example, transistor(s)) connected between them. Thus, an electrical connection is a specific type of coupling; however, not all couplings are electrical connections.

The term "source/drain region" is intended to mean a source region, a drain region, or a doped region that, depending on biasing conditions, may be a source region or a drain region.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a nonvolatile memory ("NVM") cell, wherein the NVM cell can include an antifuse component, an access transistor, and a read transistor having a control electrode. In a particular embodiment, the NVM cell can be an OTP cell, and the antifuse component can be in the form of a transistor structure. As described in detail below, process flows and structures for the NVM cell are described. A single polysilicon process can be formed. Such a process can be useful for integrating the NVM cell into a process flow intended for logic transistors. Thus, a double polysilicon process or stacked gate members are not required. The physical design of the cell is flexible, and, when incorporated into an NVM array, the physical design can be tailored to the number of interconnect levels in an existing process flow. The physical designs and processes are better understood after reading the remainder of the detailed description.

Figure 1:
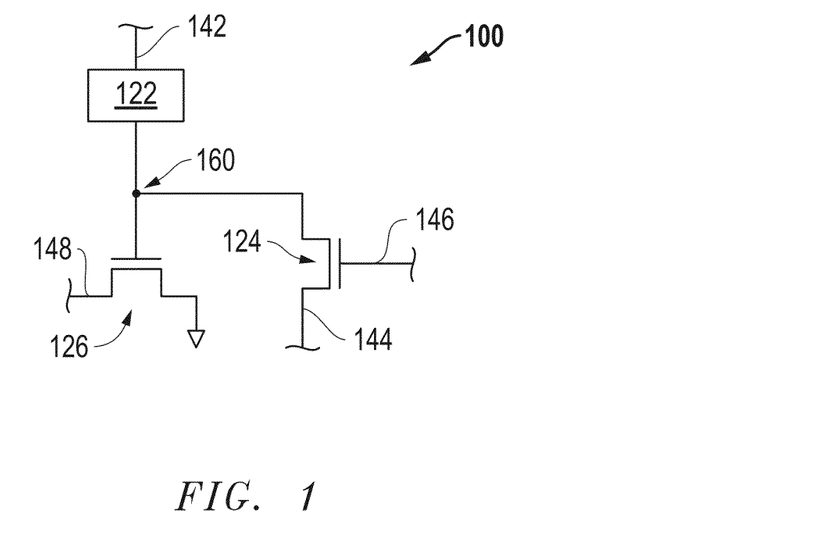
FIG. 1 includes a circuit diagram of a nonvolatile memory cell that includes an antifuse component, an access transistor, and a read transistor in accordance with an embodiment.

FIG. 1 includes a circuit diagram of a NVM cell 100 that includes an antifuse component 122, an access transistor 124, and a read transistor 126 in accordance with an embodiment. The NVM cell 100 can be part of a memory array or may be an individual memory cell outside of a memory array. In a particular embodiment, the antifuse component 122 has a pair of terminals, the access transistor 124 has a pair of current terminals and a control electrode, and the read transistor 126 has a pair of current terminals and a control electrode. In the embodiment as illustrated, the antifuse component 122 is coupled to a word line 142 or to a terminal that provides a control signal towards the control electrode of the read transistor 126 during a read operation. The other terminal of the antifuse component 122 is coupled to a current terminal of the access transistor 124 and the control electrode of the read transistor 126. The other current terminal of the access transistor 124 is coupled to a program line 144 or to a $V_{SS}$ terminal or a ground terminal. The control terminal of the access transistor 124 is coupled to an access line 146 or a terminal that controls when a programming current flows through the antifuse component 122. One of the current terminals of the read transistor 126 is coupled to a bit line or a terminal coupled to an amplifier or another circuit used in determining the programming state (programmed or unprogrammed) of the NVM cell 100. The other current terminal of the read transistor 126 is coupled to a ground terminal or a $V_{SS}$ terminal.

In a particular embodiment, any one or more of the couplings can be replaced by one or more electrical connections. One of the terminals of the antifuse component 122 is electrically connected to the word line 142 or to a terminal that provides a control signal towards the control electrode of the read transistor 126 during a read operation. The other terminal of the antifuse component 122, the current terminal of the access transistor 124, and the control electrode of the read transistor 126 can be electrically connected at a node 160. The other current terminal of the access transistor 124 can be electrically connected to the program line 144 or to the $V_{SS}$ terminal or the ground terminal. The control terminal of the access transistor 124 can be electrically connected to the access line 146 or the terminal that controls when the programming current flows through the antifuse component 122. One of the current terminals of the read transistor 126 can be electrically connected to the bit line 148 or the terminal coupled to the amplifier or the other circuit used in determining the programming state (programmed or unprogrammed) of the NVM cell 100. The other current terminal of the read transistor 126 can be electrically connected to the ground terminal or the $V_{SS}$ terminal.

Figure 2:
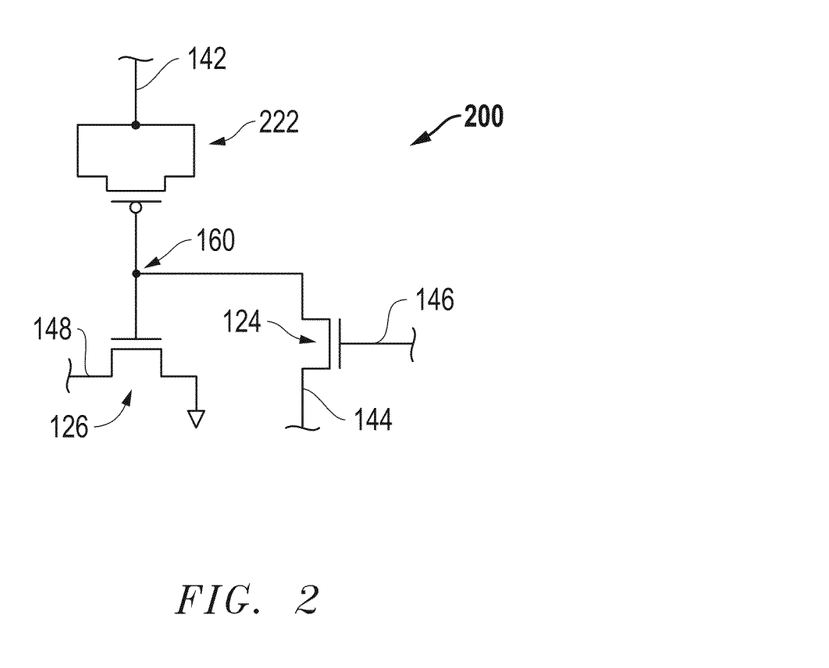
FIG. 2 includes a circuit diagram of a nonvolatile memory cell that includes an antifuse component in the form of a transistor structure, an access transistor, and a read transistor in accordance with an embodiment.

FIG. 2 includes an illustration of an embodiment that is particularly well suited for a single polysilicon process flow. The nonvolatile memory cell 200 in FIG. 2 is substantially the same as the nonvolatile memory cell 100 in FIG. 1, except that the antifuse component 122 is in the form of a transistor structure 222. As illustrated, the source/drain regions of the transistor are electrically connected to each other and the word line 142. The gate electrode of the transistor structure 222 is electrically connected to the node 160. In the embodiment as illustrated, the transistor structure 222 is a p-channel transistor structure, and the access and read transistors 124 and 126 are n-channel transistors.

Referring to FIG. 2, the NVM cell 200 can be programmed when the NVM cell is properly biased. The voltage difference between the word line 142 and the program line 144 can be a programming voltage, $V_{PP}$. In an embodiment, the word line 142 can be at approximately $V_{PP}$, and the program line 144 can be at approximately 0 volts. In another embodiment, the word line 142 can be at approximately +½ $V_{PP}$, and the program line 144 can be at approximately −½ $V_{PP}$.

The access transistor 124 is on during programming, and thus, a signal provided on the access line 146 to the gate electrode of the access transistor 124 is sufficient to turn on the access transistor 124. In a particular embodiment, the gate electrode of the access transistor 124 is at approximately $V_{DD}$ when on, and at approximately 0 volts when off. Other voltages for turning on and off the access transistor 124.

During programming, the bit line 148 is at approximately ground or 0 volts. Substantially no current flows through the read transistor 126 during a programming operation because the source and drain regions of the transistor 126 are at substantially the same voltage.

When the NVM cell 200 is programmed, the transistor structure 222 is changed to a state that more similar to a resistor. The gate dielectric layer of the transistor structure 222 no longer substantially prevents current from flowing between the gate electrode and its corresponding source/drain regions. Thus, significant current can flow through the gate dielectric layer, such as between the gate electrode and the source/drain regions of the transistor structure 222.

Note that within the NVM cell 200, during programming, the current flows through the transistor structure 222 and the access transistor 124. The current path with the access transistor 124 allows the programming current to bypass the read transistor 126, and thus, damage to the read transistor 126 during programming is substantially reduced. Compare the NVM cell 200 to a conventional NMV cell having an antifuse component and a read transistor electrically connected in series. During a programming operation of an array of conventional NVM cells, the gate dielectric layer of a selected cell, an unselected cell or a combination of selected and unselected cells may be exposed to relatively high voltages while current is flowing through the read transistor. Such a condition may cause charge to become trapped or cause another gate dielectric degradation mechanism to occur within the read transistor. Thus, one or more conventional NVM cells within the array may fail during programming or have significantly reduced expected lifetime (as measured by the number of programming operations, read operations, or a combination of programming and read operations).

During a read operation of the NVM cell 200, the word line 142 and the bit line 148 are at approximately $V_{DD}$, and the program line 144 and access line 146 are at approximately 0 volts. In another embodiment, different voltages may be used. For example, the word line 142 may be at a higher voltage as compared to the bit line 148. Further, the program line 142 may be at substantially the same voltage as compared to the word line 142, to reduce leakage current through the access transistor 124, as the access transistor 124 is in an off state during a read operation.

When the NVM cell 200 is programmed, significant current can be detected at the bit line 148, and when the NVM cell is unprogrammed, a substantially lower current or no significant current is detected at the bit line 148. The programmed NVM cells can have a significant drain current at word line voltages of approximately 0.5 V and higher. $I_{dsat}$ for the programmed NVM cells may be greater than $10^{-4}$ amperes, whereas $I_d$ for the unprogrammed NMV cells may be less than $10^{-10}$ amperes. A binary distribution of I-V characteristics will occur between the programmed and unprogrammed NVM cells.

Exemplary physical designs and process flows that can be used to form the NVM cell 200 are described below in more details. The particular physical designs and process flows are illustrative and not mean to limit the scope of the present invention.

Figure 3:
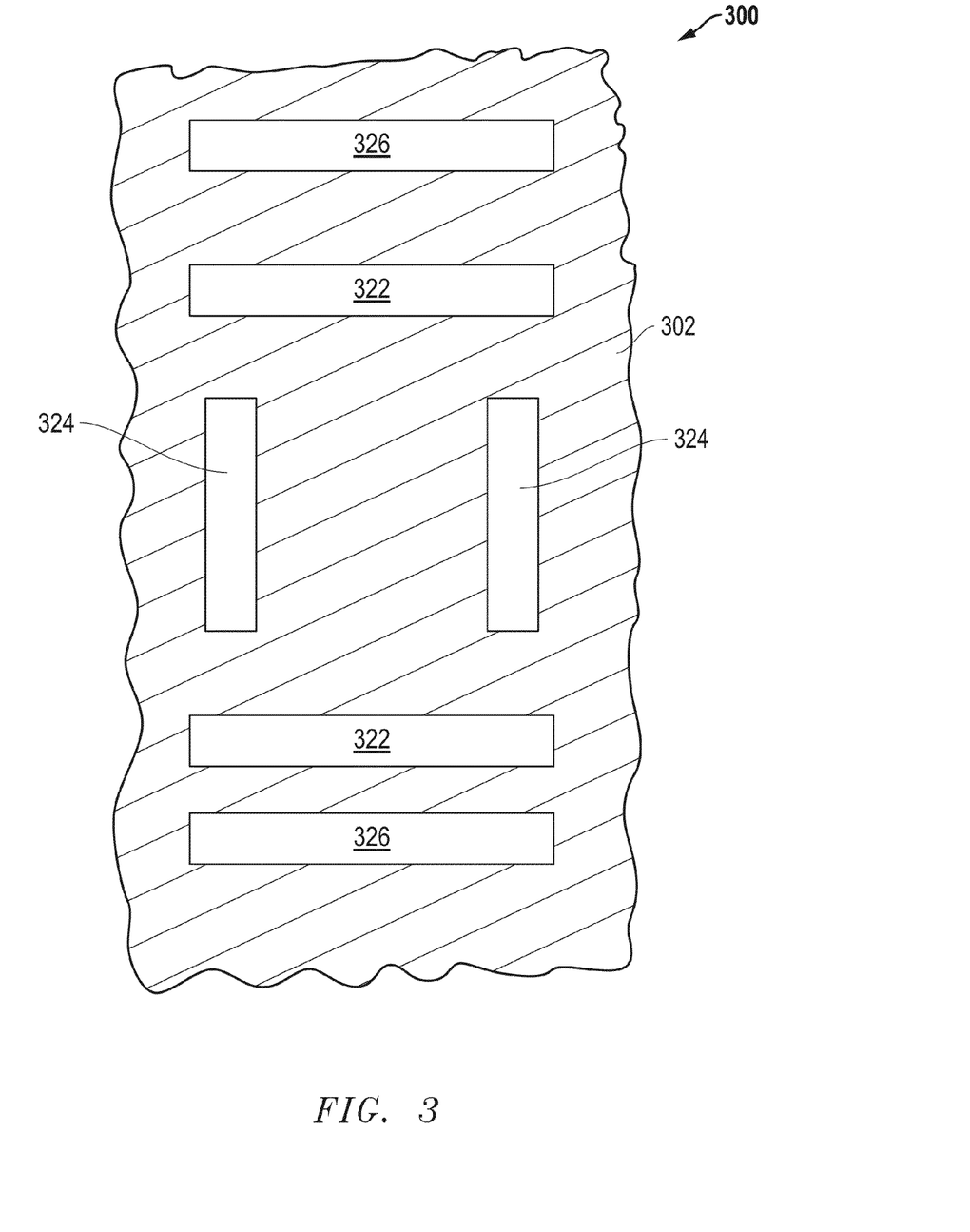
FIG. 3 includes an illustration of a top view of a portion of a workpiece that includes a field isolation region and active regions.

FIG. 3 includes a top view of a portion of an electronic device 300. As illustrated in FIG. 3, a portion of an NVM array is illustrated where four NVM cells will be formed. A field isolation region 302 is formed within or from a portion of a substrate to define active regions 322, 324, and 326. The substrate can include a semiconductor material such as silicon, germanium, carbon, another semiconductor material such as a III-V or a II-VI material, or any combination thereof. The substrate may be in the form of a substantially monocrystalline wafer or a semiconductor-on-insulator substrate. The field isolation region 302 may be formed using a shallow trench isolation process, a local oxidation of silicon process, or another suitable process. The active regions 322, 324, and 326 can include portions of the substrate where the field isolation region 302 is not formed. The antifuse components of the NVM cells will be at least partly formed within the active regions 322, the access transistors of the NVM cells will be at least partly formed within the active regions 324, and the read transistors of the NVM cells will be at least partly formed within the active regions 326.

One or more well doping steps may be performed. In an embodiment, the substrate can include a p-type dopant, and an n-well doping step may be performed to make the active regions 322 n-type doped. In another embodiment, the substrate can include an n-type dopant, and a p-well doping step may be performed to make the active regions 324 and 326 p-type doped. In a further embodiment, both n-well and p-well doping operations may be performed. The active regions 322 have an opposite conductivity type as compared to the active regions 324 and 326. Threshold adjust doping operations may be performed is needed or desired.

One or more gate dielectric layers are formed over the active regions 322, 324, and 326. In an embodiment, the gate dielectric layer has substantially the same composition and substantially the same thickness over the active regions 322, 324, and 326. In another embodiment, more than one gate dielectric layer is formed. The gate dielectric layers may have different compositions or thicknesses for the different active regions. In a particular embodiment, the gate dielectric layers have substantially the same composition, and the gate dielectric layer over the active regions 322 has a different thickness as compared to a different gate dielectric layer over the active regions 324 and 326. In another particular embodiment, the gate dielectric layer over the active regions 322 is thinner than the different gate dielectric layer over the active regions 324 and 326. The gate dielectric layer over the active regions 322 may have a thickness no greater than approximately 9 nm, no greater than approximately 7 nm, no greater than 5 nm, or no greater than 3 nm. In an embodiment, the gate dielectric layer over the active regions 322 can have a thickness of at least approximately 0.5 nm. The gate dielectric layer over the active regions 324 and 326 may have a thickness no greater than approximately 10 nm or no greater than 9 nm. In a particular embodiment, the gate dielectric layer over the active regions 322 can have a thickness of at least approximately 3 nm or at least approximately 5 nm. In another particular embodiment, the gate dielectric layer over the active regions 324 and 326 has a thickness in a range of approximately 7 nm to approximately 8 nm.

Figure 4:
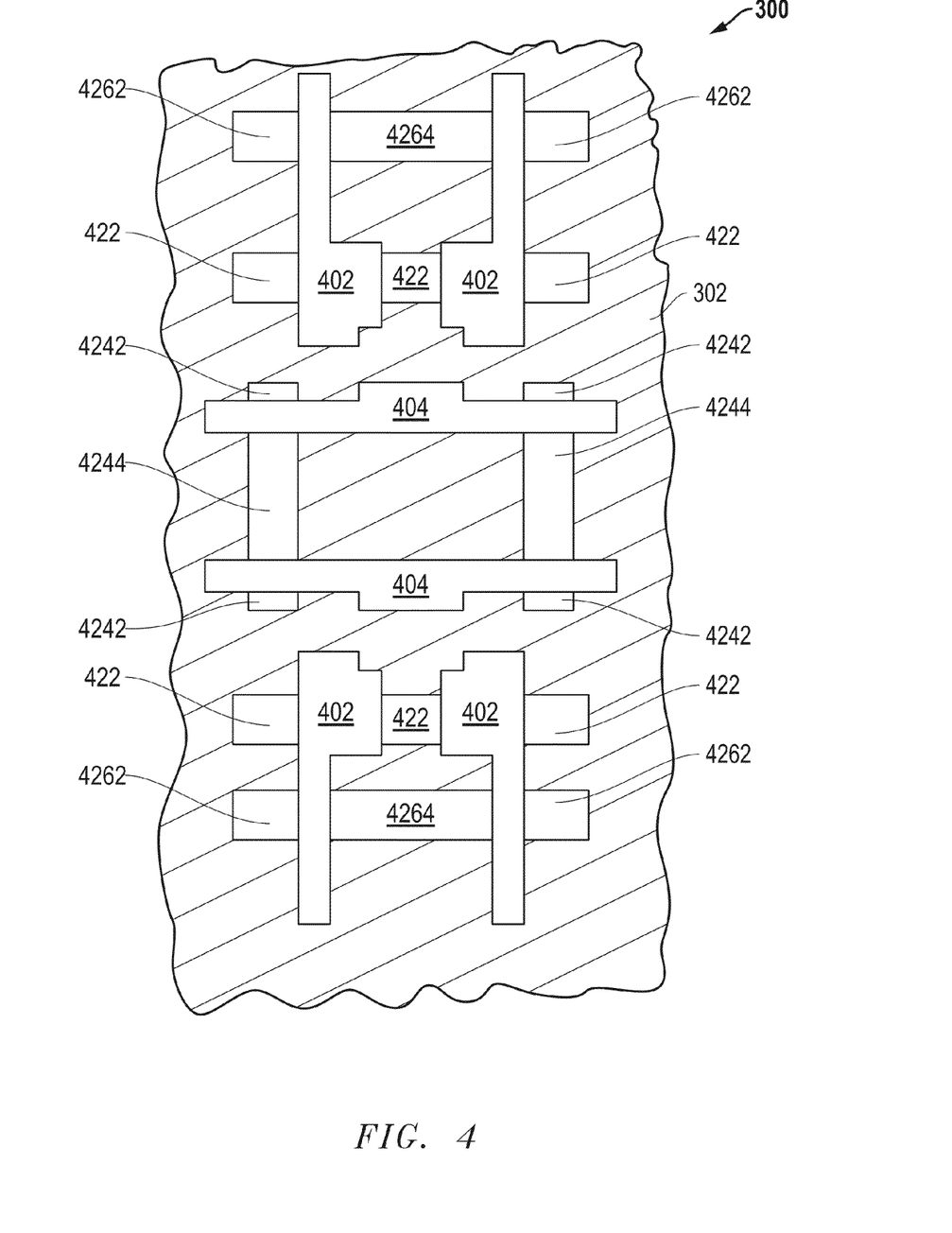
FIG. 4 includes an illustration of a top view of the workpiece of FIG. 3 after forming gate members.

FIG. 4 includes a top view of the electronic device 300 after forming gate members 402 and 404 and doped regions, as later described in more detail. A gate electrode layer is formed over the field isolation regions 302 and active regions 322, 324, and 326 (in FIG. 3). The gate electrode layer can include a semiconductor-containing or metal-containing film. In one embodiment, the gate electrode layer includes polysilicon or amorphous silicon deposited by a chemical vapor deposition process, but may include another material or may be deposited by another process in another embodiment. In one embodiment, the gate electrode layer is doped when deposited, and in another embodiment, is doped after it is deposited. In a finished device, the gate electrode layer has a dopant concentration of at least $10^{19}$ atoms/cm$^3$ when the gate electrode layer includes polysilicon or amorphous silicon. In another embodiment, the gate electrode layer can include a metal-containing film in conjunction with or in place of the semiconductor-containing film. The metal-containing film can include a refractory metal (by itself), a refractory metal alloy, a refractory metal silicide, a refractory metal nitride, a refractory metal carbide, or any combination thereof. The gate electrode layer can be patterned to form the gate members 402 and 404. Each of the gate members 402 include the gate electrodes for the transistor structures and read transistors, and the gate members 404 include the gate electrodes for the access transistors. Sidewall spacers (not illustrated in FIG. 4) are formed along the sides of the gate members 402 and 404

Doping sequences are performed to form drain, source, and source/drain regions. Source/drain regions 422 of the transistor structures for the antifuse components will be electrically connected to one another and the subsequently-formed word lines. Drain regions 4242 of the access transistors will be electrically connected to the gate members 402, and source regions 4244 of the access transistors will be electrically connected to subsequently-formed program lines. Drain regions 4262 of the read transistors will be electrically connected to subsequently-formed bit lines, and source regions 4264 of the read transistors will be electrically connected to a subsequently-formed ground terminal. The source/drain regions 422 can have a conductivity type opposite that of the drain regions 4242, source regions 4244, drain regions 4262, and source regions 4264. In an embodiment, the source/drain regions 422 are p-type doped, and the drain regions 4242, source regions 4244, drain regions 4262, and source regions 4264 are n-type doped. The peak dopant concentration for each of the source/drain regions 422, the drain regions 4242, source regions 4244, drain regions 4262, and source regions 4264 is at least $10^{19}$ atoms/cm$^3$.

Figure 5:
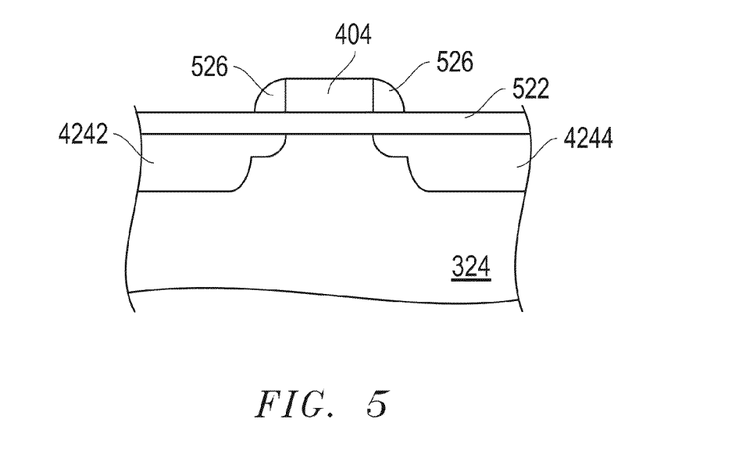
FIGS. 5 and 6 include illustrations of cross-sectional views of portions of the workpiece in FIG. 4 after forming source/drain regions.
Figure 6:
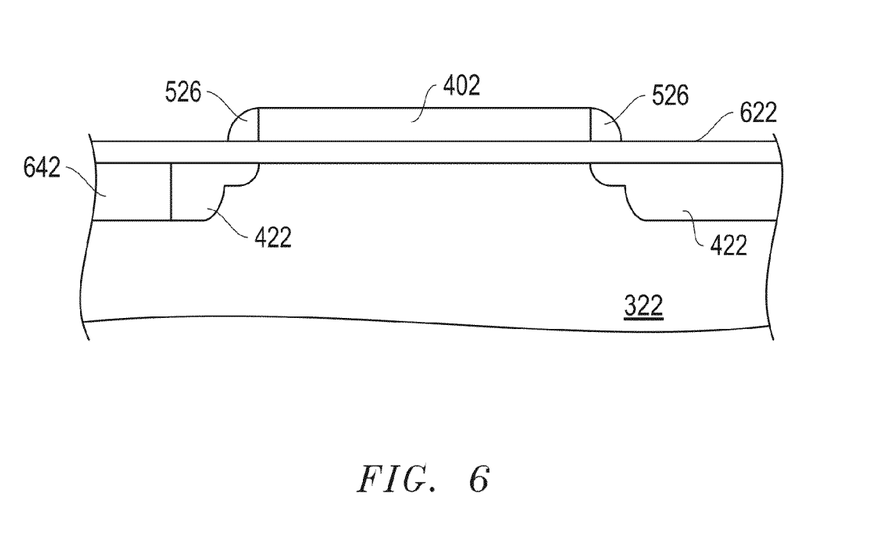

FIGS. 5 and 6 include illustrations of cross-sectional views of an access transistor and a transistor structure in accordance with exemplary embodiments. In FIG. 5, a gate dielectric layer 522 is formed over or from the active region 324 and can include any of the gate dielectric layers are previously described for the gate dielectric layers over the active regions 324. A gate electrode layer is deposited and patterned to form the gate member 404 as previously described. Extension portions of the drain and source regions 4242 and 4244 are formed, the sidewall spacers 526 are then formed, and the heavily doped portions of the drain and source regions 4242 and 4244 are then formed. The other access transistor and the read transistors may have structures substantially similar to the structure of the access transistor as illustrated in FIG. 5.

In FIG. 6, a gate dielectric layer 622 is formed over or from the active region 322 and can include any of the gate dielectric layers are previously described for the gate dielectric layers over the active regions 322. Note that in this particular embodiment, the gate dielectric layer 622 is thinner than the gate dielectric layer 522. A gate electrode layer is deposited and patterned to form the gate member 402 as previously described. Extension portions of the source/drain regions 422 and 422 are formed, the sidewall spacers 526 are then formed, and the heavily doped portions of the source/drain regions 422 are then formed. A body contact region 642 can be formed to allow an electrical connection to be made to the active region 322. The active region 322 may be within a body region, such as a well region or a portion of the substrate, and the body region can be electrically connected to the source/drain regions 422. The body contact region 642 (FIG. 6) and the source and drain regions 4242 and 4244 (FIG. 5) can have the same dopant type and concentration, and thus, may be formed during the same doping sequence. The other transistor structure may have structures substantially similar to the structure of the access transistor as illustrated in FIG. 6.

After reading this specification, the embodiments as illustrated in FIGS. 5 and 6 are merely illustrative and not meant to limit the scope of the concepts as described herein. Another process sequence or another structure can be formed and not deviate from the concepts described herein. Note that gate dielectric layers 522 and 622 and sidewall spacers 526 as illustrated in FIGS. 5 and 6 may be present in FIG. 4 but are not illustrated in FIG. 4 to simplify the positional relationships between the gate members 402 and 404 and other features illustrated in FIG. 4. If needed or desired, a self-aligned silicide process sequence can be performed to silicide portions (not illustrated) of the gate members 402, 404, source/drain regions 422. drain regions 4242, source regions 4244, drain regions 4262, and source regions 4264.

Figure 7:
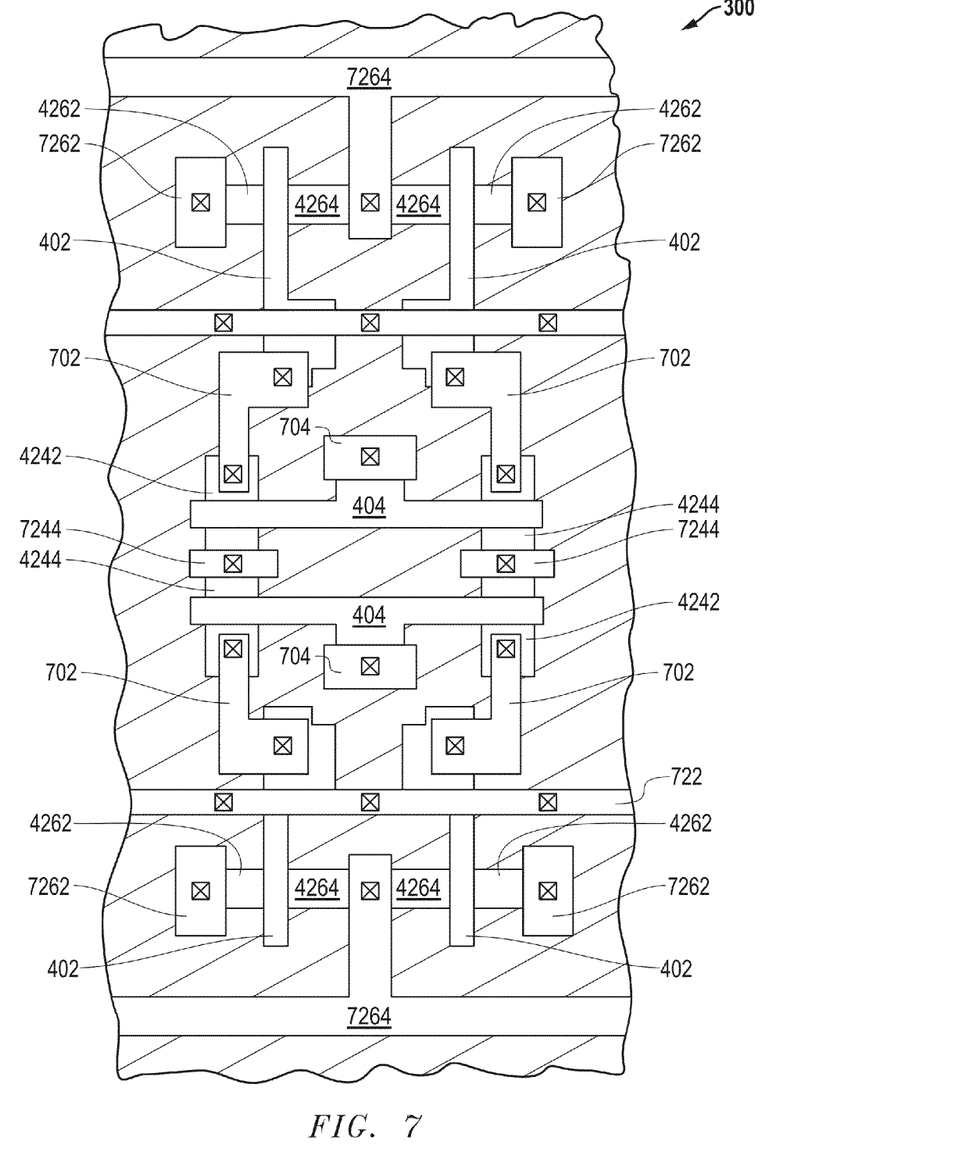
FIG. 7 includes an illustration of a top view of the workpiece of FIGS. 5 and 6 after forming an interconnect level including interconnect members.

FIG. 7 includes an illustration of a top view of the electronic device 300 after forming an interconnect level that includes interconnect members. An interlevel dielectric ("ILD") layer can be formed over the gate members 402 and 404, the field isolation region 302, and the active regions that include the drains, source, and source/drain regions as previously described. The ILD layer can include a single oxide film or a plurality of insulating films. The plurality of insulating films can include an etch-stop film, a polish-stop film, an antireflective film, a bulk oxide film, another suitable insulating film, or any combination thereof. The ILD layer can be patterned to define contact openings to gate members 402 and 404, drain, source, and source/drain regions within the active regions, and other portions of the electronic device 300 (not illustrated). A conductive layer can be formed and patterned to form the interconnect members 702, 722, 704, 7244, 7262, and 7264. The conductive layer can include a single conductive film or a plurality of conductive films. The plurality of conductive films can include a barrier film, an adhesion film, an antireflective film, a bulk conductive film, another conductive suitable film, or any combination thereof. The interconnect members may be used with or without conductive plugs, using a single inlaid or dual inlaid process, or the like. Similar to the interconnect members, the conductive plugs can include a single conductive film or a plurality of conductive films. The plurality of conductive films can include a barrier film, an adhesion film, an antireflective film, a bulk conductive film, another conductive suitable film, or any combination thereof. The Xs within boxes note where interconnect members make electrical connections to an underlying features. The interconnect members may have contact portions that extend into the ILD layer and directly contact the underlying features or may overlie conductive plugs that directly contact the underlying features. In this specification, corresponding contacts refer to such contact potions of the interconnect members or such conductive plugs.

The interconnect members 702 are electrically connected to the gate members 702 and the drain regions 4242 of the access transistors, and thus, complete the formation of the nodes, such as node 160 as illustrated in FIGS. 1 and 2. The interconnect members 722 are electrically connected to the source/drain regions 422 of the transistor structures and are part of the word lines for the NVM cells. The interconnect members 722 do not have corresponding contacts to the gate members 402 or any other gate member or gate electrodes within the NVM array. Thus, the word lines are electrically connected to source/drain regions 422 but are not electrically connected to gate members 402 or any other gate members or gate electrodes within the memory array. Outside the NVM array, the word lines may only contact source/drain regions of transistors within row or column decoders, row or column access (or address) strobes, or the like, and thus, the word lines may not contact any gate members or gate electrodes within the electronic device.

The interconnect members 704 are electrically connected to the gate members 404 that includes gate electrodes for the access transistors. At a subsequent interconnect level (not illustrated), other interconnects will be formed that are electrically connected to the interconnect members 704 and are parts of access lines. The lengths of such other interconnects and lengths of the interconnect members 722 are substantially parallel to one another within the portion of the array illustrated. The interconnect members 7244 are electrically connected to the source regions 4244 of the access transistors. At a subsequent interconnect level (not illustrated), other interconnects will be formed that are electrically connected to the interconnect members 7244 and are parts of program lines. The lengths of such other interconnects and lengths of the interconnect members 722 are substantially perpendicular to one another.

The interconnect members 7262 are electrically connected to the drain regions 4262 of the read transistors. At a subsequent interconnect level (not illustrated), other interconnects will be formed that are electrically connected to the interconnect members 7262 and are parts of bit lines. The lengths of such other interconnects and lengths of the interconnect members 722 are substantially perpendicular to one another. The interconnect members 7264 are electrically connected to the source regions 4264 of the read transistors and are electrically connected to a ground terminal for the electronic device 300.

Further ILD layers and interconnect levels can be formed as needed or desired. Interconnect members that are parts of the program lines and further interconnect members that are parts of the word lines may be part of the same interconnect level or different interconnect levels. After all ILD layers and interconnect levels are formed, an encapsulating layer may be formed over the uppermost interconnect level to form a substantially completed electronic device.

After reading this specification, skilled artisans will appreciate that other physical designs and process flows may be used. For example, drain regions 4242 of the access transistors can be made longer so that the interconnect members 704 can extend lengthwise across the NVM cells, similar to the interconnect members 702, without forming an electrical connection to the interconnect members 702. This embodiment may reduce the number of interconnect levels at the expense of increasing cell size.

In another embodiment, the drain regions 4242 of the access transistors can have a shape similar to a combination of the drain regions 4242, as illustrated, and the interconnect members 702. Buried contacts can be made between the modified drain regions of the access transistors and the gate members 402. The interconnect members 704 can be modified as previously described, so that an extra interconnect level may be removed; however, the removal of the extra interconnect level may be at the expense of process complexity associated with buried contacts.

After reading this specification, skilled artisans will be able to determine a physical design for the NVM cells for a particular number of interconnect levels and design rules. Clearly, the other physical designs and process flows can be used and not deviate from the scope of the concepts herein.

The physical design and process flows of the NVM cells as illustrated and described herein can allow for a relative compact memory cells. The process can be implemented as a single polysilicon process, meaning that gate members within the electronic device are all formed from the same gate electrode layer, even though the gate electrode layer may not include polysilicon or even silicon. Thus, the process flow is well suited for logic transistors that are transistors outside of the NVM array, wherein the logic transistors and NVM array may be part of a standalone memory integrated circuit, a microprocessor, a microcontroller, or the like.

The physical design of the NVM cells can be tailored to the number of interconnect levels used. If the remainder of the electronic device requires at least three interconnect levels, the physical design of the NVM cells as illustrated is particular well suited for such an electronic device. If the electronic device has only two interconnect levels, the physical design of the NVM cells can be modified as previously described.

After reading this specification, skilled artisans will appreciate the flexibility in implementing different physical designs and processing flows, that allow the NVM array to be tailored to a particular application without departing from the concepts as described herein. The NVM memory cell array can be integrated into an existing logic process flow with no or only some changes. Because the NVM cells can be formed using an existing process flow with existing materials, NVM cells can be fabricated without having to develop exotic materials or using process steps that have little margin.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device including a nonvolatile memory cell, wherein the nonvolatile memory cell can include a substrate; an access transistor having source/drain regions at least partly within the substrate, a gate dielectric layer overlying the substrate, and a gate electrode overlying the gate dielectric layer; a read transistor having source/drain regions at least partly within the substrate, a gate dielectric layer overlying the substrate, and a gate electrode overlying the gate dielectric layer; and an antifuse component including a first electrode lying at least partly within the substrate; an antifuse dielectric layer overlying the substrate, and a second electrode overlying the antifuse dielectric layer. The second electrode of the antifuse component can be coupled to one of the source/drain regions of the access transistor and to the gate electrode of the read transistor.

In an embodiment of the first aspect, the antifuse component includes a transistor structure, wherein the first electrode includes source/drain regions at least partly within the substrate and electrically connected to each other the antifuse dielectric layer includes a gate dielectric layer, and the second electrode includes a gate electrode. In a particular embodiment, the access and read transistors are n-channel transistors, and the transistor structure is a p-channel transistor structure. In another particular embodiment, the gate dielectric layers of the access and read transistors have substantially a same composition and substantially a same thickness. In a more particular embodiment, the gate dielectric layer of the transistor structure has substantially a same composition and substantially a same thickness as the gate dielectric layers of the access and read transistors.

In a further particular embodiment, a gate electrode layer includes a first gate member that includes the gate electrodes of the read transistor and the transistor structure, and a second gate member that includes the gate electrode of the access transistor. In a more particular embodiment, the electronic device further includes a first interconnect member electrically connects the source/drain regions of the transistor structure to each other. In an even more particular embodiment, the electronic device further includes a second interconnect member that electrically connects a source/drain region of the access transistor to the first gate member.

In still a further particular embodiment, the electronic device further includes a first interconnect member, wherein the nonvolatile memory cell is part of a nonvolatile memory array, and, within the nonvolatile memory array, the first interconnect member does not have a corresponding contact to any gate member within the nonvolatile memory array. In yet a further particular embodiment, the transistor structure includes an active region that includes source/drain regions and a body contact region.

In a second aspect, a process of forming an electronic device including a nonvolatile memory cell can include forming a field isolation region over a substrate, wherein the field isolation region defines a first active region, a second active region, and a third active region spaced apart from one another, forming a first gate member over a portion of the first active region, and forming a second gate member over portions of the second and third active regions. The method can also include forming first source/drain regions within other portions of the first and third active regions that are not covered by the first and second gate members, forming second source/drain regions within other portions of the second active region, and forming a first interconnect member that electrically connects a source/drain region within the first active region to the second gate member, wherein an antifuse component of the first nonvolatile memory cell includes a portion of the second gate member and the second active region.

In an embodiment of the second aspect, forming the first and second gate members including depositing a gate electrode layer, and patterning the gate electrode layer to form the first and second gate members. In another embodiment, forming the first source/drain regions includes implanting an n-type dopant into the other portions of the first and third active regions. In a particular embodiment, the first and third active regions are p-type doped. In another particular embodiment, forming the second source/drain regions including implanting a p-type dopant into the other portions of the second active region. In a more particular embodiment, the second active region is n-type doped. In an even more particular embodiment, the process further includes implanting an n-type dopant into the substrate to form an n-well region. In yet an even more particular embodiment, the process further includes forming a body contact region in the second active region.

In a further embodiment of the second aspect, the process further includes forming a second interconnect member, wherein the second interconnect member is electrically connected to the second source/drain regions. In still a further embodiment, the nonvolatile memory cell includes only a single layer of polysilicon.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising a nonvolatile memory cell comprising:
    forming a field isolation region over a substrate, wherein the field isolation region defines a first active region, a second active region, and a third active region spaced apart from one another;
    forming a first gate member over a portion of the first active region;
    forming a second gate member over portions of the second and third active regions;
    forming first source/drain regions within other portions of the first and third active regions that are not covered by the first and second gate members;
    forming second source/drain regions within other portions of the second active region; and
    forming a first interconnect member that electrically connects a source/drain region within the first active region to the second gate member, wherein an antifuse component of the nonvolatile memory cell includes a portion of the second gate member and the second active region.

2. The process of claim 1, wherein forming the first and second gate members comprises:
    depositing a gate electrode layer; and
    patterning the gate electrode layer to form the first and second gate members.

3. The process of claim 1, wherein forming the first source/drain regions comprises implanting an n-type dopant into the other portions of the first and third active regions.

4. The process of claim 3, wherein the first and third active regions are p-type doped.

5. The process of claim 3, wherein forming the second source/drain regions comprising implanting a p-type dopant into the other portions of the second active region.

6. The process of claim 5, wherein the second active region is n-type doped.

7. The process of claim 6, further comprising implanting an n-type dopant into the substrate to form an n-well region.

8. The process of claim 7, further comprising forming a body contact region in the second active region.

9. The process of claim 1, further comprising forming a second interconnect member, wherein the second interconnect member is electrically connected to the second source/drain regions.

10. The process of claim 1, wherein the nonvolatile memory cell includes only a single layer of polysilicon.

\* \* \* \* \*